United States Patent
Moholt

(10) Patent No.: US 8,477,225 B2
(45) Date of Patent: *Jul. 2, 2013

(54) METHOD AND APPARATUS PROVIDING PIXEL ARRAY HAVING AUTOMATIC LIGHT CONTROL PIXELS AND IMAGE CAPTURE PIXELS

(75) Inventor: Jorgen Moholt, Moss (NO)

(73) Assignee: Micron Technology, Inc., Boise, ID (US)

( * ) Notice: Subject to any disclaimer, the term of this patent is extended or adjusted under 35 U.S.C. 154(b) by 931 days.

This patent is subject to a terminal disclaimer.

(21) Appl. No.: 12/481,436

(22) Filed: Jun. 9, 2009

(65) Prior Publication Data

US 2009/0244348 A1  Oct. 1, 2009

Related U.S. Application Data

(63) Continuation of application No. 11/223,045, filed on Sep. 12, 2005, now Pat. No. 7,554,071.

(30) Foreign Application Priority Data

Sep. 1, 2005  (GB) .................................. 0517804.1

(51) Int. Cl.
*H04N 3/14* (2006.01)
*H04N 5/335* (2011.01)
*H01L 21/00* (2006.01)

(52) U.S. Cl.
USPC .......................... 348/308; 348/302; 250/208.1

(58) Field of Classification Search
USPC ................. 348/300–302, 308, 296, 241, 243, 348/245, 221.1, 229.1, 362–368; 250/208.1
See application file for complete search history.

(56) References Cited

U.S. PATENT DOCUMENTS

| | | | |
|---|---|---|---|
| 4,992,653 A | 2/1991 | Kawahara et al. | |
| 5,937,027 A | 8/1999 | Thevenin et al. | |
| 6,829,008 B1 | 12/2004 | Kondo et al. | |
| 7,038,820 B1 * | 5/2006 | Kindt et al. | 358/474 |
| 7,078,701 B2 | 7/2006 | Ishii et al. | |
| 7,088,395 B2 | 8/2006 | Takayama et al. | |
| 7,154,547 B2 | 12/2006 | Oda | |
| 2002/0101532 A1 * | 8/2002 | Takayama et al. | 348/362 |
| 2005/0001143 A1 | 1/2005 | Rhodes | |

(Continued)

FOREIGN PATENT DOCUMENTS

| | | |
|---|---|---|
| EP | 0 393 945 | 10/1990 |
| EP | 1 227 662 A2 | 7/2002 |
| WO | WO 02/056581 | 7/2002 |

*Primary Examiner* — Aung S Moe
*Assistant Examiner* — Mekonnen Dagnew
(74) *Attorney, Agent, or Firm* — Dickstein Shapiro LLP

(57) ABSTRACT

A pixel array uses two sets of pixels to provide accurate exposure control. One set of pixels provide continuous output signals for automatic light control (ALC) as the other set integrates and captures an image. ALC pixels allow monitoring of multiple pixels of an array to obtain sample data indicating the amount of light reaching the array, while allowing the other pixels to provide proper image data. A small percentage of the pixels in an array is replaced with ALC pixels and the array has two reset lines for each row; one line controls the reset for the image capture pixels while the other line controls the reset for the ALC pixels. In the columns, at least one extra control signal is used for the sampling of the reset level for the ALC pixels, which happens later than the sampling of the reset level for the image capture pixels.

17 Claims, 7 Drawing Sheets

U.S. PATENT DOCUMENTS

| | | |
|---|---|---|
| 2005/0088552 A1 | 4/2005 | Erhardt et al. |
| 2005/0205761 A1 | 9/2005 | Shah |
| 2006/0113459 A1* | 6/2006 | Yang et al. .................. 250/208.1 |
| 2008/0218608 A1* | 9/2008 | Rossi et al. ................... 348/243 |

* cited by examiner

METHOD AND APPARATUS PROVIDING PIXEL ARRAY HAVING AUTOMATIC LIGHT CONTROL PIXELS AND IMAGE CAPTURE PIXELS

This is a continuation application of U.S. patent application Ser. No. 11/223,045,filed on Sept. 12, 2005, now U.S. Pat. No. 7,554,071, the disclosure of which is incorporated by reference in its entirety.

FIELD OF THE INVENTION

The invention relates generally to imaging devices and more particularly to a pixel array providing automatic light control for accurate exposure control in an imaging device.

BACKGROUND OF THE INVENTION

A CMOS imager circuit includes a focal plane array of pixel cells, each one of the cells including a photosensor, for example, a photogate, photoconductor or a photodiode overlying a substrate for accumulating photo-generated charge in the underlying portion of the substrate. Each pixel cell has a readout circuit that includes at least an output field effect transistor formed in the substrate and a charge storage region formed on the substrate connected to the gate of an output transistor. The charge storage region may be constructed as a floating diffusion region.

In a CMOS imager, the active elements of a pixel cell perform the necessary functions of: (1) photon to charge conversion; (2) accumulation of image charge; (3) transfer of accumulated charge to a storage region, typically operated as a floating diffusion region; (4) resetting the storage region to a known state; (5) selection of a pixel for readout; and (6) output and amplification of a signal representing pixel charge. The charge at the storage region is typically converted to a pixel output voltage by the capacitance of the storage region and a source follower output transistor.

CMOS imagers of the type discussed above are generally known as discussed, for example, in U.S. Pat. Nos. 6,140,630, 6,376,868, 6,310,366, 6,326,652, 6,204,524 and 6,333,205, assigned to Micron Technology, Inc., which are hereby incorporated by reference in their entirety.

FIG. 1 illustrates a block diagram for a CMOS imager 10. The imager 10 includes a pixel array 20. The pixel array 20 comprises a plurality of pixels arranged in a predetermined number of columns and rows. The pixels of each row in array 20 are all turned on at the same time by a row select line and the pixels of each column are selectively output by a column select line. A plurality of row and column lines are provided for the entire array 20.

The row lines are selectively activated by the row driver 32 in response to row address decoder 30 and the column select lines are selectively activated by the column driver 36 in response to column address decoder 34. Thus, a row and column address is provided for each pixel. The CMOS imager 10 is operated by the control circuit 40, which controls address decoders 30, 34 for selecting the appropriate row and column lines for pixel readout, and row and column driver circuitry 32, 36, which apply driving voltage to the drive transistors of the selected row and column lines.

Each column contains sampling capacitors and switches in a sample and hold (S/H) circuit 38 comprising sampling and holding capacitors and switches associated with the column driver 36 reads a pixel reset signal $V_{rst}$ and a pixel image signal $V_{sig}$ for each selected pixel. A differential signal ($V_{rst}$-$V_{sig}$) is produced by differential amplifier 42 for each pixel. The signal is digitized by analog-to-digital converter 45 (ADC). The analog-to-digital converter 45 supplies the digitized pixel signals to an image processor 50, which forms a digital image output 52.

Typical CMOS imager pixel cells have either a three transistor (3T) or four transistor (4T) design, though pixel cells having a larger number of transistors are also known. A 4T or higher T pixel may include at least one electronic device such as a transistor for transferring charge from the photosensor to the storage region and one device, also typically a transistor, for resetting the storage region to a predetermined charge level prior to charge transference.

A 3T pixel does not typically include a transistor for transferring charge from the photosensor to the storage region. A 3T pixel typically contains a photo-conversion device for supplying photo-generated charge to the storage region; a reset transistor for resetting the storage region; a source follower transistor having a gate connected to the storage region, for producing an output signal; and a row select transistor for selectively connecting the source follower transistor to a column line of a pixel array. In a 3T pixel cell, the charge accumulated by a photo-conversion device may be read out prior to resetting the device to a predetermined voltage. These 3T pixel cells may be used to support automatic light control (ALC) operations. ALC is used to control the amount of light integrated by a pixel cell. ALC operations may determine a time for readout based on the amount of charge generated by the photo-conversion device and may adjust the image integration time and thus the amount of charge further generated by the photo-conversion device in response to the charge present on the photo-conversion device at a particular time.

Although the 3T design (or 4T pixel operated in a 3T mode) may be used to support ALC operations, the 4T pixel configuration is preferred over the 3T pixel configuration for readout operations because it reduces the number of "hot" pixels in an array (those that experience increased dark current), and it diminishes the kTC noise that 3T pixels experience with the readout signals.

Since light conditions may change spatially and over time, automatic light control is advantageous to ensure that the best image is obtained by controlling the image sensor's exposure to the light. In some imager applications, there is a need to use the present illumination during the actual exposure of an image in a current frame to control the exposure because the use of the imager's illumination in a prior frame may not be sufficient for the intended application. Further discussion on ALC and real-time exposure control may be found in U.S. patent application Ser. No. 10/846,513, filed on May 17, 2004, and Ser. No. 11/052,217, filed on Feb. 8, 2005, assigned to Micron Technology, Inc., both of which are incorporated by reference herein.

Correlated double sampling (CDS) is a technique used to reduce noise and obtain a more accurate pixel signal. For CDS, the storage region, also termed herein as the floating diffusion region, begins at a predetermined reset voltage level by pulsing a reset transistor; thereafter, the reset voltage produced by the source follower transistor is read out through the row select transistor as a pixel reset signal $V_{rst}$. Then, integrated photo-generated charge from the photosensor is transferred to the floating diffusion region by operation of a transfer transistor and a pixel image signal $V_{sig}$ produced by the source follower transistor is read out through the row select transistor. The two values, $V_{rst}$ and $V_{sig}$, are subtracted thereby reducing common noise. The reset signal $V_{rst}$ and image signal $V_{sig}$ are obtained during the same image frame in a CDS operation.

In a conventional 4T pixel cell, because the transfer transistor transfers the photo-generated charge from the photosensor to the floating diffusion region and readout circuitry, it is not possible to read out photo-generated charge without altering the charge on the photosensor. Thus, when a 4T readout path is employed to monitor charge level in an ALC operation, the transfer of charge carriers through the transfer transistor tends to destroy or alter the image signal, thereby resulting in a degraded image. Therefore, ALC is not readily used with a conventional 4T pixel cell.

Accordingly, there is a desire and need for automatic light control in a device with low dark current and kT/C noise during an exposure period that uses present illumination, yet does not alter the image signal during the charge integration time of the photosensor in the process.

BRIEF SUMMARY OF THE INVENTION

In various exemplary embodiments, the invention provides accurate exposure control in a pixel array comprising imaging pixels having a transfer gate and four or more transistors and using CDS while using pixels that do not use a transfer gate for automatic light control. These embodiments allow monitoring of multiple pixel cells of the array to obtain sample data indicating the amount of light reaching the array, while allowing the image pixels to provide proper image data.

In one exemplary embodiment, a small percentage of the pixels in a four-transistor (4T) pixel (or pixel having more than four transistors) array is replaced with pixels that do not use a transfer gate, such as 3T pixels. The pixel array is provided with two reset lines for each row; one reset line controls the reset for the 4T or higher T pixels while the other reset line controls the reset for the 3T pixels.

In another exemplary embodiment, a small percentage of the pixels in a 4T or higher T pixel array are operated in a 3T mode, with the transfer transistor always turned on. The pixel array is provided with two reset lines for each row; one reset line controls the reset for the conventional operation of 4T or higher T pixels, while the other reset line controls the reset for the 4T pixels that are operated in 3T mode.

BRIEF DESCRIPTION OF THE DRAWINGS

The foregoing and other advantages and features of the invention will become more apparent from the detailed description of the exemplary embodiments provided below with reference to the accompanying drawings, in which.

DETAILED DESCRIPTION OF THE INVENTION

In the following detailed description, reference is made to the accompanying drawings, which form a part hereof and show by way of illustration specific exemplary embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The described progression of processing and operating steps exemplifies embodiments of the invention; however, the sequence of steps is not limited to that set forth herein and may be changed as is known in the art, with the exception of steps necessarily occurring in a certain order.

The terms "pixel" and "pixel cell," as used herein, refer to a photo-element unit cell containing a photo-conversion device and associated circuitry for converting photons to an electrical signal. The pixels discussed herein are illustrated and described with reference to using three transistor (3T) and four transistor (4T) pixel circuits for the sake of example only. It should be understood that the invention may be used with respect to other imaging pixel arrangements having more (e.g., 5T, 6T) than four transistors or with pixel arrangements using devices other than transistors to provide output signals. Accordingly, in the following discussion it should be noted that whenever 4T pixels are discussed, pixels having additional transistors, used for example, for an anti-blooming, conversion gain, or shutter gate may be used. Likewise, although 3T pixels are discussed for providing automatic light control, it should be noted that any pixel that enables the integrating charge on a photosensor to be read during a charge integration period may be used. The following detailed description is, therefore, not to be taken in a limiting sense.

Figure 1:
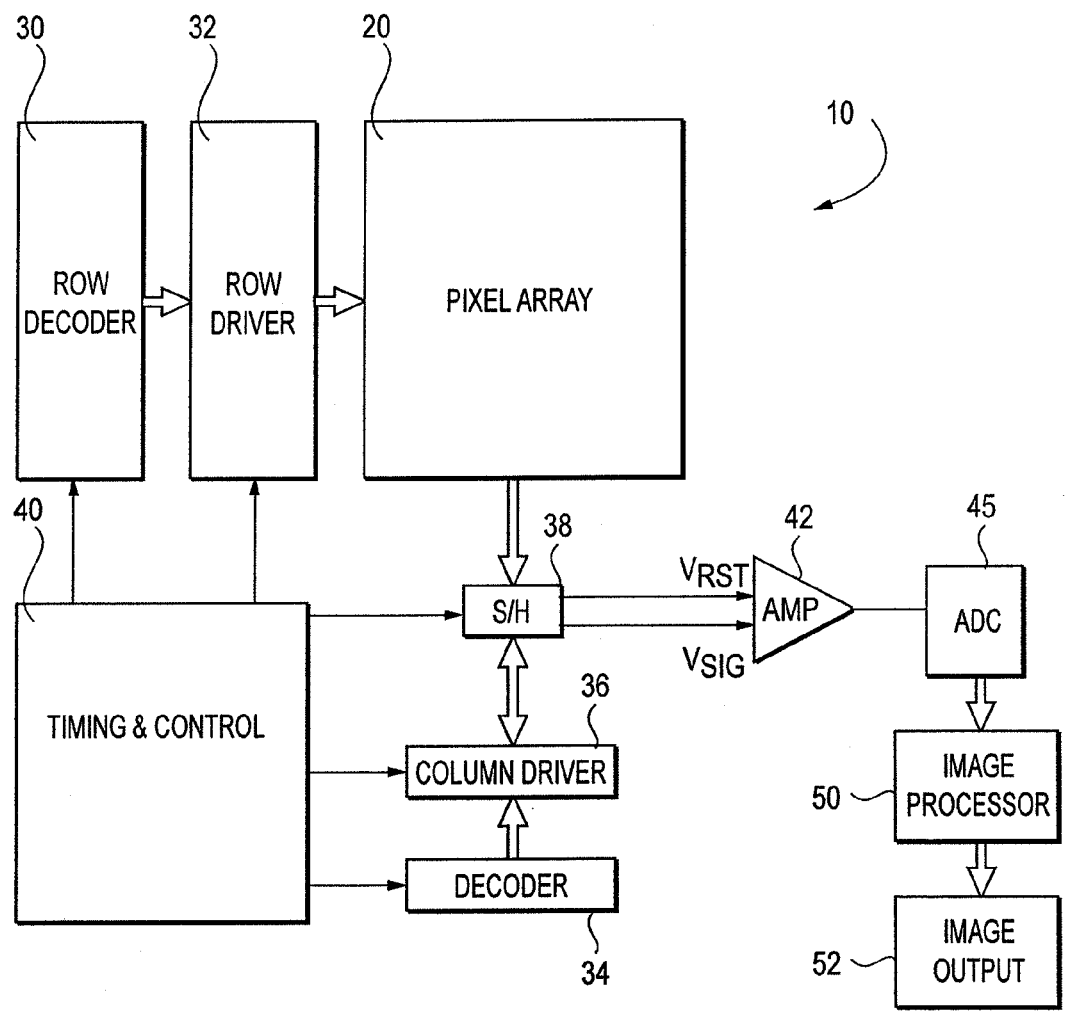
FIG. 1 is a block diagram of a CMOS imager.
Figure 2:
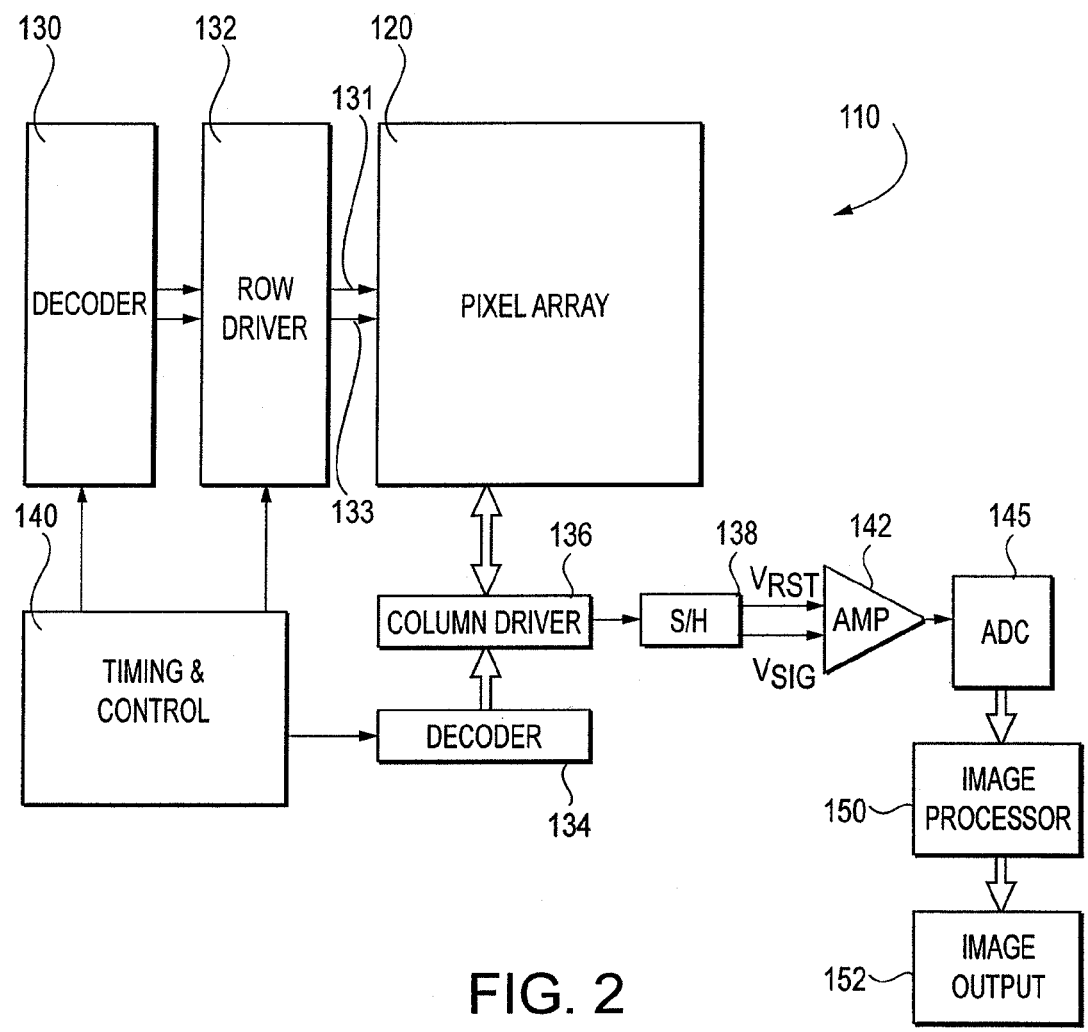
FIG. 2 is a block diagram of a CMOS imager constructed in accordance with an embodiment of the invention.

Referring to the figures, where like reference numbers designate like elements, FIG. 2 shows an exemplary imager 110 having an automatic light control function constructed in accordance with the invention. The imager 110 includes a pixel array 120 containing 4T pixels and a small percentage of 3T pixels (or 4T pixels operated in 3T mode with the transfer transistors always turned on, as discussed below in more detail) for automatic light control. Each row of the pixel array 120 has two reset lines 131, 133 controlling the reset operations for the pixels of the row; reset line 131, for example, may control the reset of the 3T pixels in the row, while reset line 133, for example, may control the reset of the 4T pixels in the row. The row lines are selectively activated by the row driver 132 in response to row address decoder. A column is also addressed and selected for pixel readout. Thus, a row and column address is provided for each pixel.

The CMOS imager 110 is operated by the control circuit 140, which controls address decoders 130, 134 for selecting the appropriate row and column lines for pixel readout, and row and column driver circuitry 132, 136, which apply driving voltage to the drive transistors for the selected row and column lines.

Each column contains sampling capacitors and switches in a sample and hold (S/H) circuit 138 associated with the column driver 136 that reads a pixel reset signal Vrst and a pixel image signal Vsig for selected pixels. A differential signal (Vrst−Vsig) is produced by differential amplifier 140 for each pixel. The signal is digitized by analog-to-digital converter 145 (ADC). The analog-to-digital converter 145 supplies the digitized pixel signals to an image processor 150, which forms a digital image output 152.

As mentioned above, pixel array 120 contains 4T pixels and a small percentage of 3T pixels. For example, approximately 1% of the pixels in array 120 are 3T pixels. 4T pixels provide low dark current and true correlated double sampling and are imaging pixels. 3T pixels are ideally suited for automatic light control, which is the ability to monitor the signal level so that exposure time can be well-controlled for each frame without altering the image signal.

The 3T and 4T pixels typically are not reset at the same time. To accommodate the two types of pixels having different reset times, two reset lines 131, 133 for each row are routed into the pixel array 120. The two reset lines 131, 133 are routed to each array row, although each pixel in a row is only connected to one of the two reset lines 131, 133, depending on whether the pixel is a 3T pixel or a 4T pixel. The 3T pixels are connected to reset line 131 and the 4T pixels are connected to reset line 133.

While the reset level must be sampled at different times, the image signal level can be sampled at the same time for both 3T and 4T pixels. Therefore, extra logic is introduced in the column circuitry to enable different reset level sampling times.

Figure 3:
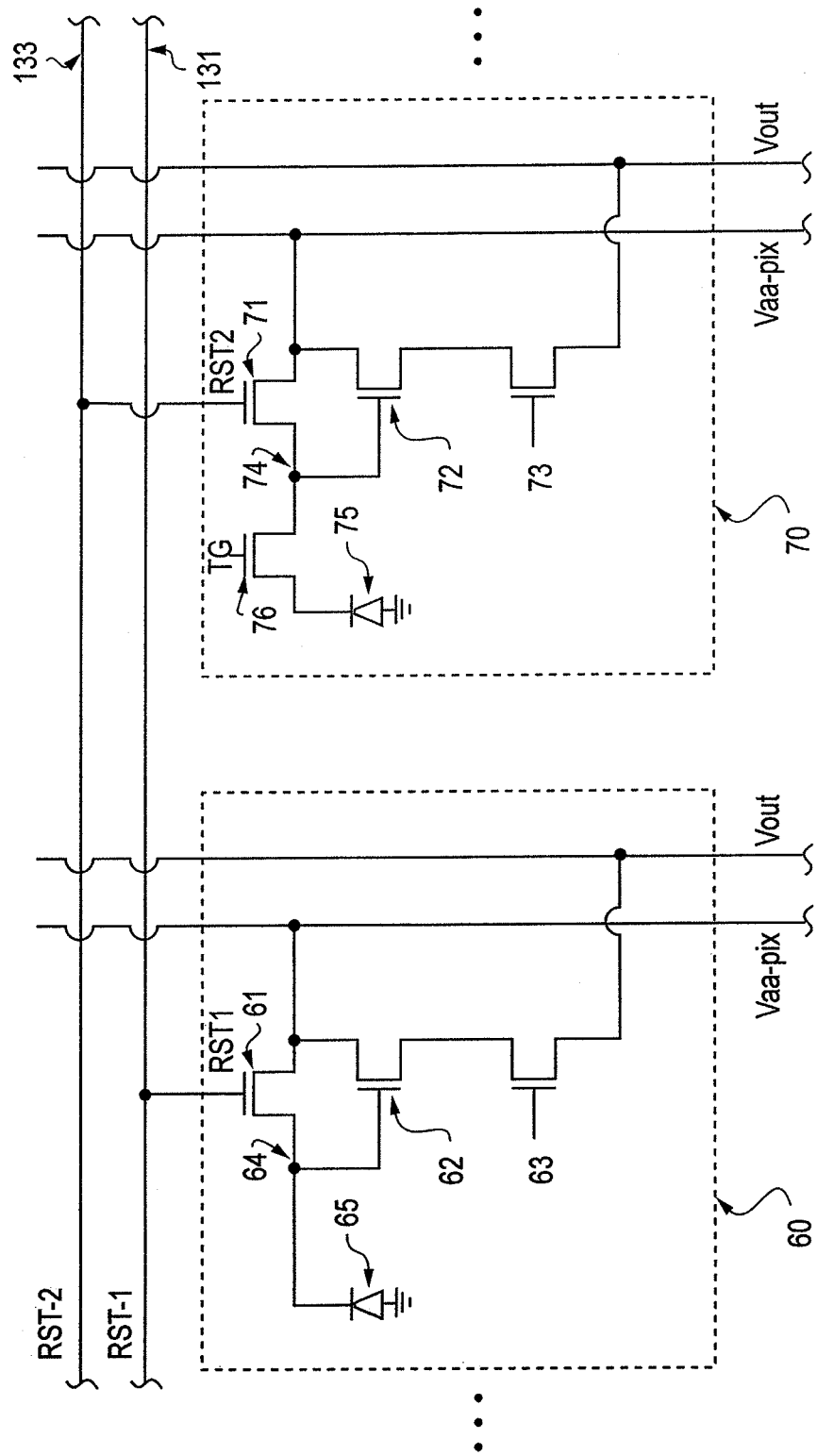
FIG. 3 is a schematic diagram for a section of a row in a pixel array constructed in accordance with an embodiment of the invention.
Figure 4:
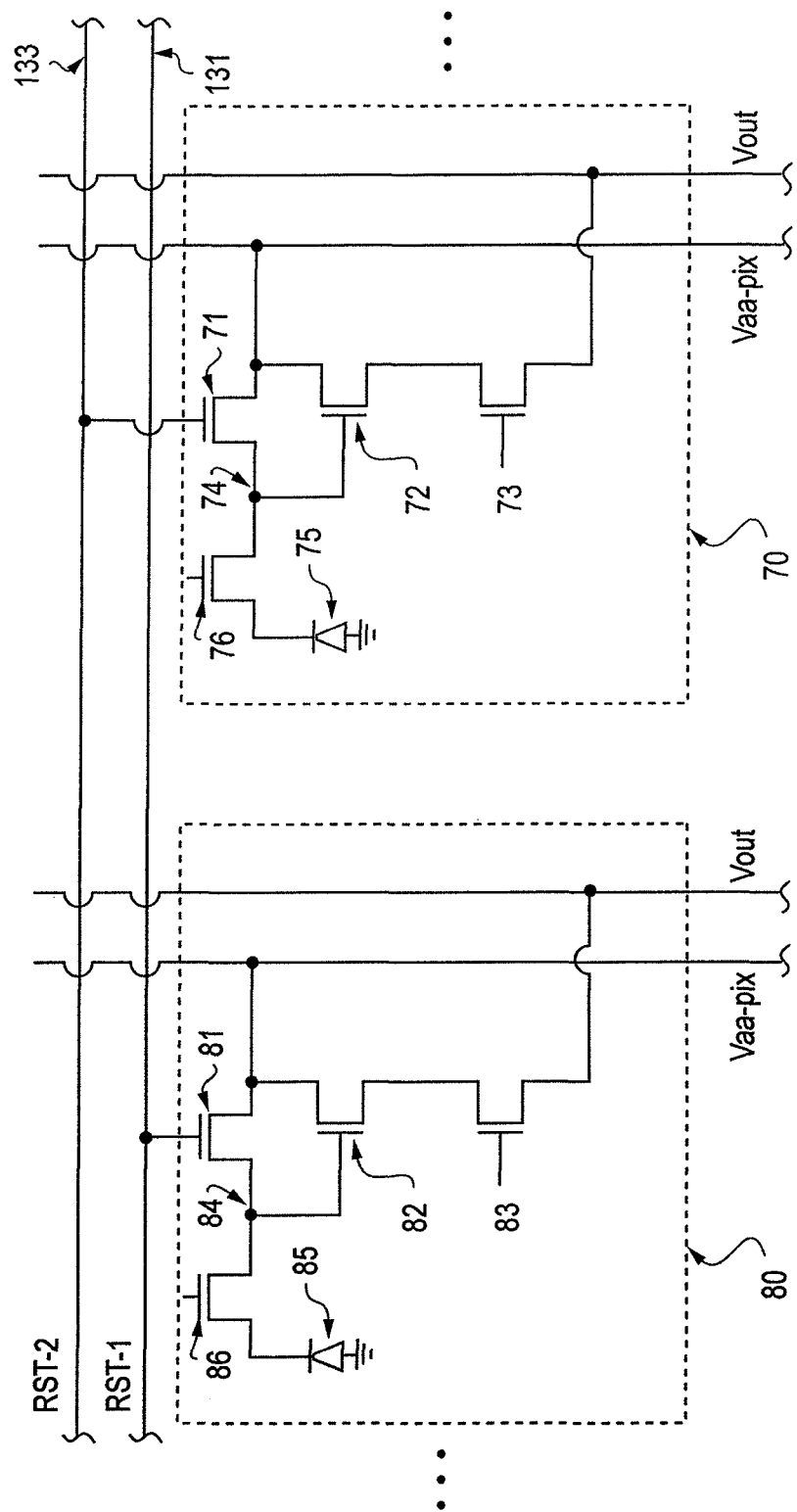
FIG. 4 is a schematic diagram for a section of a row in a pixel array constructed in accordance with another embodiment of the invention.

The connections of 3T and 4T pixels of pixel array 120 to reset and column lines are shown in FIGS. 3 and 4. An exemplary embodiment of the invention depicted in FIG. 3 combines the 4T pixel 70 with a 3T pixel 60 in the same row described below. The 3T pixel comprises a reset transistor 61, source follower transistor 62, and a row select transistor 63 and can be formed by any suitable method. The 4T pixel 70 comprises transfer transistor 76, reset transistor 71, source follower transistor 72, and a row select transistor 73. In other embodiments of the invention, these pixels may employ more transistors than the illustrated 3T and 4T design (5T, 6T, etc.). Similarly, other embodiments could provide pixel arrangements using devices other that transistors to provide output signals; another alternative includes a capacitor (not shown) electrically coupled to the floating diffusion regions 64, 74 for assisting the floating diffusion regions 64, 74 in storing the transferred charges, adjusting the conversion gain of the pixel, and/or to make the pixel response more linear.

A photosensor 65 converts incident light into charge. A floating diffusion region 64 receives charge from the photosensor 65 and is connected to the reset transistor 61 and the gate of the source follower transistor 62. The source follower transistor 62 outputs at different times a reset signal $V_{rst}$ and an image signal $V_{sig}$ (collectively shown in FIG. 3 as Vout). Vout (either $V_{rst}$ or $V_{sig}$) represents the charge present at the floating diffusion region 64 which is provided to a sample and hold circuit 138 (FIG. 2) when the row select transistor 63 is turned on. The reset transistor 61 resets the floating diffusion region 64 to a known potential after transfer of charge from the photosensor 65 (when RST-1 is applied). The photosensor 65 may be a photodiode, a photogate, a photoconductor, or other type of photosensor. For ALC operation, it is not necessary to output a reset sample $V_{rst}$ from the 3T pixel. The reset level may also come from an extra pixel row (not shown) where an estimated reset level has been extracted. Alternatively, the row select transistor 63 may be operated to only output $V_{sig}$ as the output signal Vout.

Imaging pixel 70 is a four transistor (4T) pixel. The four transistors include a transfer transistor 76, reset transistor 71, source follower transistor 72, and a row select transistor 73. A photosensor 75 converts incident light into charge. A floating diffusion region 74 receives charge from the photosensor 75 through the transfer transistor 76 (when activated by control signal TG) and is connected to the reset transistor 71 and the gate of the source follower transistor 72. The source follower transistor 72 outputs a reset signal $V_{rst}$ and an image signal $V_{sig}$ (collectively shown as Vout). Vout represents the charge present in the floating diffusion region 74 which is provided to a sample and hold circuit 138 (FIG. 2) when the row select transistor 73 is turned on. The reset transistor 71 resets the floating diffusion region 74 to a known potential prior to transfer of charge from the photosensor 75 (when RST-2 is applied). Similar to photosensor 65, the photosensor 75 may be a photodiode, a photogate, a photoconductor, or other type of photosensor.

The two pixels 60, 70 are provided in the same row having reset lines 131, 133. Reset transistor 61 of pixel 60 is connected to reset line 131, which controls the reset transistor for all 3T pixels in the row. Reset transistor 71 of pixel 70 is connected to reset line 133, which controls the reset transistor for all 4T pixels in the row.

FIG. 4 is a schematic diagram of two pixels 80, 70 in a single row of another embodiment of pixel array 120. Pixels 80, 70 are both 4T pixels. Pixel 70 is as described above with respect to FIG. 3. Pixel 80 is a four transistor (4T) pixel that is operated in 3T mode. The four transistors of pixel 80 include a transfer transistor 86, reset transistor 81, source follower transistor 82, and a row select transistor 83. Transfer transistor 86 is always turned on to operate the pixel 80 in 3T mode. A photosensor 85 converts incident light into charge. A floating diffusion region 84 receives charge from the photosensor 85 through the activated transfer transistor 86 and is connected to the reset transistor 81 and the gate of the source follower transistor 82. The source follower transistor 82 outputs a reset signal $V_{rst}$ and an image signal $V_{sig}$ (collectively shown in FIG. 3 as Vout). Vout (either $V_{rst}$ or $V_{sig}$) represents the charge present at the floating diffusion region 84 to a sample and hold circuit 138 (FIG. 2) when the row select transistor 83 is turned on. The reset transistor 81 resets the floating diffusion region 84 to a known potential prior to transfer of charge from the photosensor 85. Similar to pixel 70, the photosensor 85 may be a photodiode, a photogate, a photoconductor, or other type of photosensor. Also, like the FIG. 3 3T pixel, pixel 80 may be operated so that only the image signal $V_{sig}$ is output and sampled for ALC operation.

As described above with respect to FIG. 3, the two pixels 80, 70 are provided in the same row having reset lines 131, 133. Reset transistor 81 of pixel 80 is connected to reset line 131, which controls the reset transistor for all 4T pixels in the row that are operated in 3T mode. Reset transistor 71 of pixel 70 is connected to reset line 133, which controls the reset transistor for all 4T pixels in the row that are operated in 4T mode. Therefore, pixel 80 and pixel 70 may be reset at different times.

Figure 5:
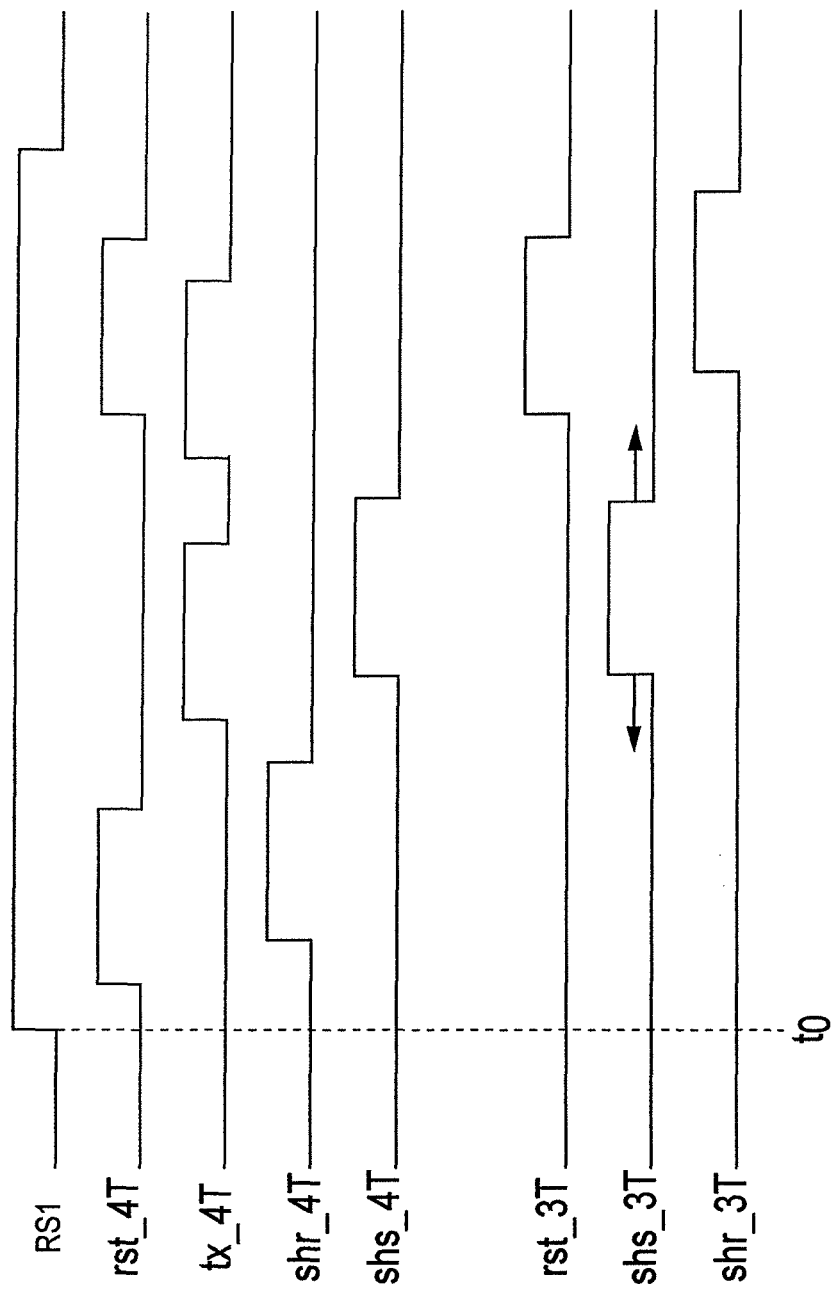
FIG. 5 is an exemplary timing diagram for a CMOS imager constructed in accordance with an embodiment of the invention.

The reset timing of the pixels 60, 70 of FIG. 3 is illustrated in FIG. 5. FIG. 5 is an exemplary timing diagram for a row having 3T pixels and 4T pixels, as controlled by the timing and control circuit 140. For simplicity, pixel circuit operations are described with reference to a single pair of pixel cells 60, 70; however, each row of array 120 having pixels 60, 70 may operate as described below in connection with FIG. 5. Also, the exemplary timing diagram may be used for a row having 4T pixels, some of which are operated in 3T mode by keeping the transfer transistor constantly on, such as the pair of pixels in a row illustrated in FIG. 4, wherein the timing of 3T pixel 60 (FIG. 3) may represent the timing of 4T pixel 80 (FIG. 4) that is being operated in 3T mode. Furthermore, signals RS1, rst_4T, tx_4T, shr_4T, shs_4T, rst_3T, shs_3T, and shr_3T are provided to illustrate the timing of one exemplary operation and do not in any way limit the invention to the illustrated operation.

FIG. 5 shows one exemplary frame readout operation which may be used with the pixel arrays depicted in FIG. 3 or 4 that begins at time t0. The readout operation begins by resetting the floating diffusions 64, 74 of pixels 60, 70, respectively. For each active row of the array 120, the timing and control circuitry 140 pulses a row select signal (RS1) high to turn on the row select transistors 63, 73 of pixels 60, 70, respectively. Timing and control circuitry 140 pulses a reset signal (rst_4T) on reset line 133 high to activate each 4T pixel's (pixel 70) reset transistor 71. At this time, sampling capacitors of S/H circuit 138 store the reset voltage Vrst(4T) of the 4T pixel 70 (when shr_4T is activated). The reset voltage Vrst(4T) is read out in sequence for each row of the array 120 that includes 4T pixels.

After an image integration period ends, timing and control circuitry 140 also pulses a transfer signal (tx_4T) to activate the transfer transistor 76 of pixel 70. Any charge on the photosensor 75 of pixel 70 is thus transferred through transfer transistor 76 to the floating diffusion region 74. This marks the end of the 4T integration period, or charge generating period, for the photosensor 75. At this time, sampling capacitors of S/H circuit 138 store the signal voltages Vsig(4T) and Vsig(3T) of the 4T pixel 70 (when shs_4T is activated) and 3T pixel 60 (when shs_3T is activated), respectively. These are photo image signals related to the amount of light incident on the pixels. The sample voltages Vsig(4T) and Vsig(3T) are read out in sequence for each row of the array 120 that includes 3T and 4T pixels. It should be noted that the sampling (or comparing) of Vsig for the 3T pixel may occur at any time during charge integration of the 4T pixels to provide a signal for use in ALC operations. Accordingly the sample and hold signal shs_3T is illustrated with arrows in FIG. 5, denoting this flexibility.

As for the ALC operation itself, for each column, an extracted common average reset level for all 3T pixels in the pixel array and the signal level from each of the 3T pixels may be sampled and converted to get a value for use in ALC control. Alternatively, the signal from the 3T pixel in a column may be compared with a predetermined voltage level, as described in further detail in U.S. patent application Ser. No. 10/846,513 to Olsen et al., rather than sampling and converting the signal, to decrease power consumption and/or increase ALC pixel readout speed.

Timing and control circuitry 140 then pulses the transfer transistor 76 of pixel 70 and reset transistors 61, 71 of pixels 60, 70, to reset the photosensors 65, 75 and floating diffusion regions 64, 74, respectively. Sampling capacitors 138 take the reset voltage Vrst(3T) of the 3T pixel 60 (shr_3T). The reset voltage Vrst(3t) is read out in sequence for each row of the array 120 that includes 3T pixels. After completion of readouts, all signals are returned to low; and the sequence of steps is repeated row-by-row for each row of the pixel array 120. For simplicity, FIG. 5 shows only a single integration period of one representative row of pixels having 3T and 4T pixels.

In the above-described embodiment, the photo signal level is sampled at the same time for both 3T (or 4T operated in 3T mode) and 4T pixels, while the reset level is sampled at different times. Therefore, extra logic must be introduced in the column circuitry to be able to select between at least, but not limited to, different reset level sampling time, depending on which row is selected. However, the timing of the frame readout operation is not limited to the above-described embodiment. For example, it is possible to read out the 3T signal level at the same time as the 4T reset level, and vice versa. The start and stop time of the exposure would then be slightly different for the 3T and 4T pixels. Moreover, since the 3T and 4T pixels have integration periods, it is not crucial that the integration start and stop time be identical for the 3T and 4T pixels. Regardless of whether their exposure time begins and ends together, a gain factor should be applied to the 3T pixels in order to calculate a readout voltage consistent with the surrounding 4T pixels, as will be described in further detail below.

Figure 6:
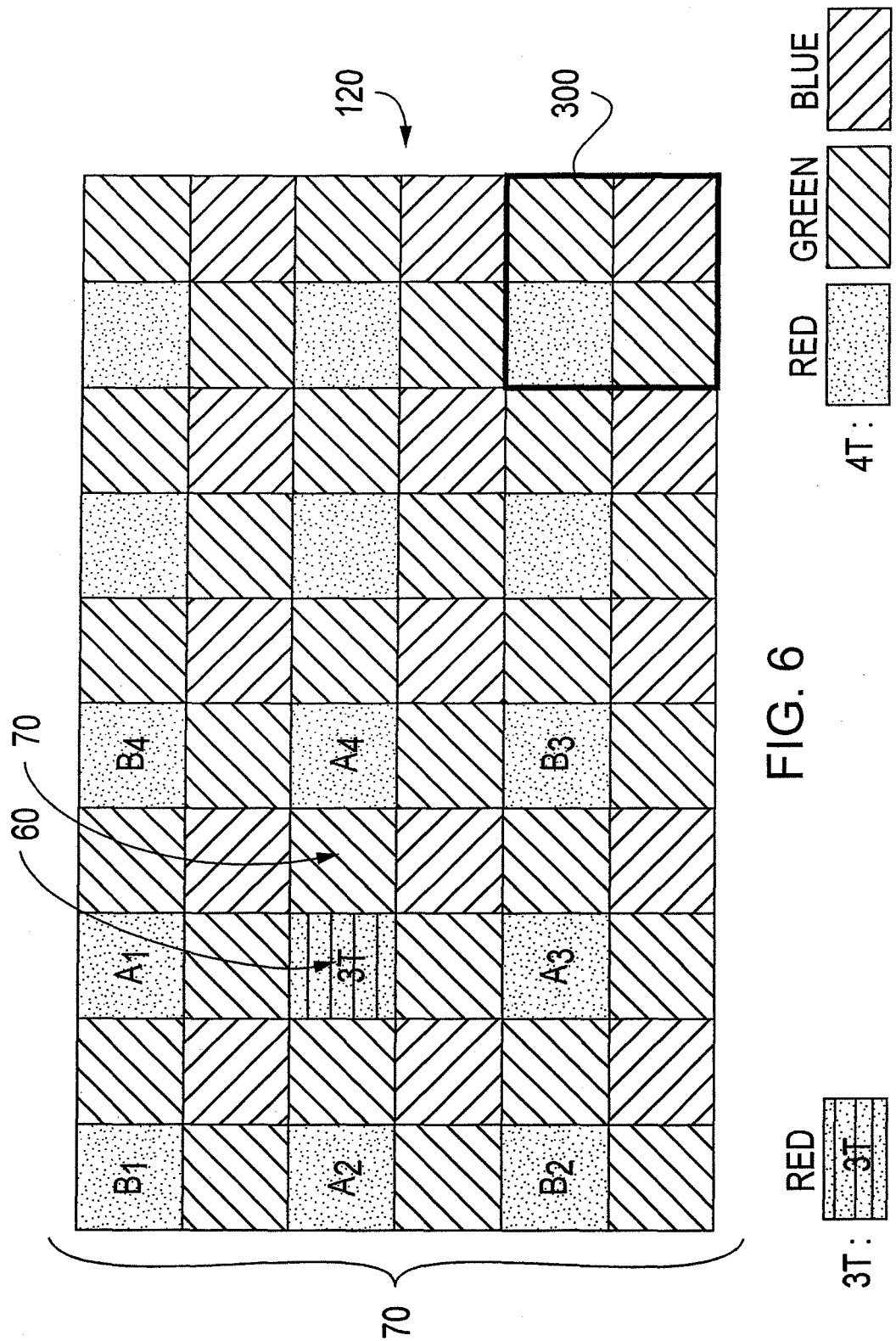
FIG. 6 is a plan view of a section of a pixel array constructed in accordance with an embodiment of the invention.

The 3T pixels 60 may be provided along a row of 4T pixels 70 in a configuration as illustrated in FIG. 6. FIG. 6 is a plan view of a section of a pixel array 120 of FIG. 2. The pixel array 120 features pixels arranged in a Bayer pattern 300 consisting of alternating rows, one having alternating red and green pixels, and the next having alternating green and blue pixels. All of the pixels shown in FIG. 6 are 4T pixels 70 having either red, green, or blue associated color filters, with the exception of a single red 3T pixel 60. As mentioned above, approximately 1% of the red pixels may be replaced with 3T pixels. The 3T pixels are constantly monitored and may be read out after the integration period of the 4T pixel ends.

Since the sensitivity, or responsivity, of 3T pixels 60 is not the same as the sensitivity of 4T pixels 70, a gain factor may be applied to the 3T pixel 60 to estimate what the readout of a 4T pixel would be at that location. An exemplary method of estimating the gain factor includes an assumption that the average readout of the surrounding 4T pixels 70 will be the same as the average readout voltage of the 3T pixel. Therefore, an average readout voltage is calculated by taking the average voltage of the surrounding red 4T pixels. For example, the average of four red 4T pixels surrounding the red 3T pixel 60 would be calculated as follows:

$$Vavg(4T)=(V(A_1)+V(A_2)+V(A_3)+V(A_4))/4.$$

In another example, the average of eight red 4T pixels surrounding the red 3T pixel 60 would be calculated as follows:

$$Vavg(4T)=((V(A_1)+V(A_2)+V(A_3)+V(A_4)+V(B_1)+V(B_2)+V(B_3)+V(B_4))/8.$$

The gain factor is then calculated as follows:

$$\text{Gain factor}=Vavg(4T)/Vavg(3T).$$

Therefore, the readout voltage of the 3T pixels 60 would have the gain factor applied to it by multiplying it by the ratio of average readout voltage of the surrounding 4T pixels, divided by the ratio of average readout voltage of the surrounding 3T pixels. Although the above gain factor was described as being applied to a 3T pixel, it should also be noted that a gain factor would also be applied to a 4T pixel operated in 3T mode. It should also be noted that although the initial average readout voltage estimate will be inaccurate when the image sensors start capturing frames, after several frames, the average estimate will improve since the average calculation may be updated and performed for every frame. The gain factor may be applied by the image processor 150 (FIG. 2) which receives the integrated pixel signals, or the image processor, or other processor, can control the gain of amplifier 142, or other amplifier in the analog pixel signal processing chain.

The 3T signal, as originally read out, is used for automatic light control. Automatic light control may be performed in accordance with the methods described in U.S. patent application Ser. No. 10/846,513, filed on May 17, 2004, and Ser. No. 11/052,217, filed on Feb. 8, 2005, assigned to Micron Technology, Inc, which are herein incorporated by reference.

Figure 7:
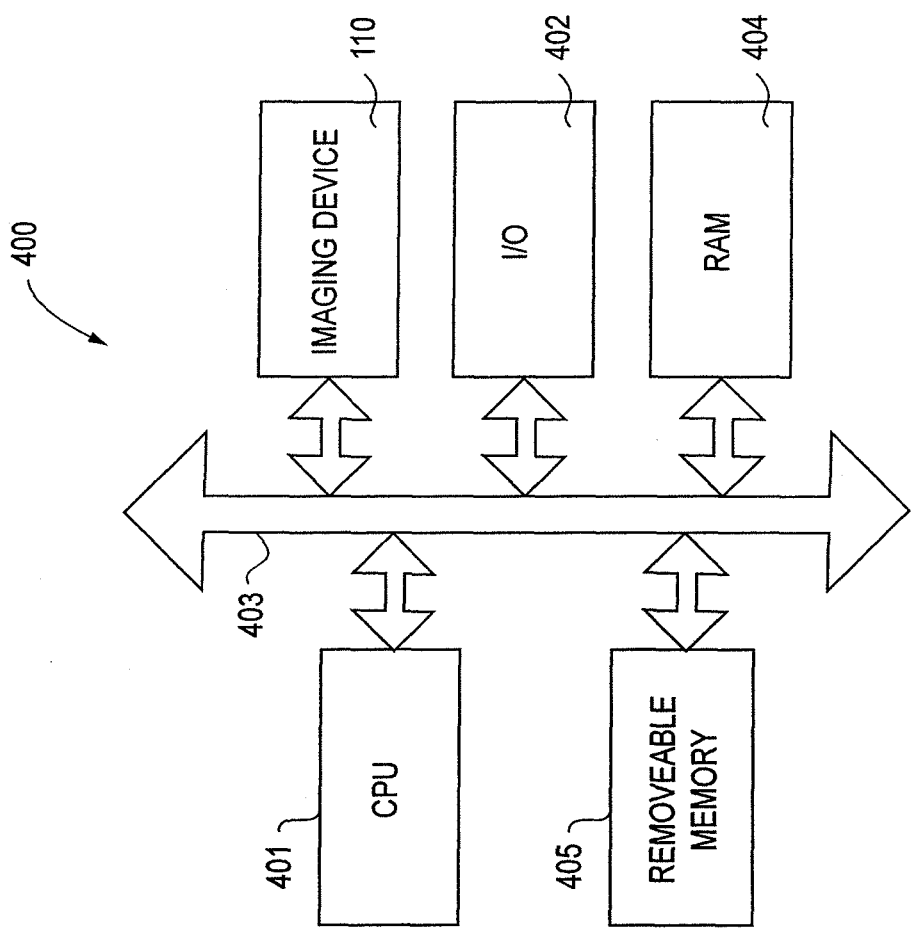
FIG. 7 is a block diagram for a processor-base system constructed in accordance with an embodiment of the invention.

FIG. 7 illustrates a processor-based system 400 including the image sensor 110 of FIG. 2 and employing the exemplary pixel array discussed with reference to FIGS. 2-6. The processor-based system 400 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other image sensing systems.

The processor-based system 400, for example a camera system, generally comprises a central processing unit (CPU) 401, such as a microprocessor, that communicates with an input/output (I/O) device 402 over a bus 403. Image sensor 400 also communicates with the CPU 405 over bus 403. The processor-based system 900 also includes random access memory (RAM) 404, and can include removable memory 405, such as flash memory, which also communicate with CPU 401 over the bus 403. Image sensor 400 may be combined with a processor, such as a CPU, digital signal processor, or microprocessor, with or without memory storage on a single integrated circuit or on a different chip than the processor.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. A pixel array comprising:
   a plurality of image capture pixels in a pixel row for providing image capture signals, each of said plurality of image capture pixels configured to transfer charge to a corresponding charge storage region after an integration period;
   at least one automatic light control pixel in said pixel row for providing an automatic light control signal, said at least one automatic light control pixel configured to transfer charge to a corresponding charge storage region during said integration period;
   a first reset line for resetting said charge storage regions of said plurality of image capture pixels; and
   a second reset line for resetting said charge storage region of said at least one automatic light control pixel.

2. The pixel array of claim 1, wherein each of said plurality of image capture pixels comprises at least a photo sensor, said charge storage region, and a reset transistor connected to said first reset line.

3. The pixel array of claim 1, wherein said at least one automatic light control pixel comprises at least a photosensor for providing charge to said charge storage region during said integration period, and a reset transistor connected to said second reset line for resetting said charge storage region.

4. The pixel array of claim 3, wherein said at least one automatic light control pixel is configured to continuously transfer charge to said corresponding charge storage region during said integration period.

5. The pixel array of claim 1 further comprising a control circuit for providing a first reset signal on said first reset line at a different time than providing a second reset signal on said second reset line.

6. The pixel array of claim 5, wherein said plurality of image capture pixels have different integration times than said at least one automatic light control pixel.

7. The pixel array of claim 1, wherein said at least one automatic light control pixel has a calculated output voltage with an applied gain factor, based on a ratio of an average output voltage of a group of said plurality of image capture pixels surrounding said automatic light control pixel to an average output voltage of said automatic light control pixel.

8. The pixel array of claim 1, wherein said at least one automatic light control pixel comprises a photosensor directly coupled to said charge storage region.

9. The pixel array of claim 1, wherein said at least one automatic light control pixel comprises a photosensor and a transfer transistor connected between said photosensor and said charge storage region, said transfer transistor configured to transfer charge to said charge storage region during at least a portion of said integration period.

10. A pixel array comprising:
    a plurality of image capture pixels, wherein each image capture pixel has a transfer transistor between a photosensor and a floating diffusion region for transferring charge at the end of an integration period;
    a plurality of automatic light control pixels, wherein each automatic light control pixel is configured to transfer charge from a photosensor to a floating diffusion region of said automatic light control pixel during said integration period;
    a first reset line for resetting said plurality of image capture pixels; and
    a second reset line for resetting said plurality of automatic light control pixels.

11. The pixel array of claim 10, further comprising a control circuit for providing a first reset signal on said first reset line at a different time than providing a second reset signal on said second reset line.

12. The pixel array of claim 11, wherein said plurality of automatic light control pixels has a different integration time than said plurality of image capture pixels.

13. The pixel array of claim 11, wherein said one of said plurality of automatic light control pixels has a calculated output voltage with an applied gain factor, based on a ratio of an average output voltage of a group of said plurality of image capture pixels surrounding said automatic light control pixel to an average output voltage of said automatic light control pixel.

14. The pixel array of claim 10, wherein said photosensor of each automatic light control pixel is directly coupled to said charge storage region.

15. The pixel array of claim 10, wherein each automatic light control pixel comprises a transfer transistor connected between said photosensor and said floating diffusion region, said transfer transistor configured to transfer charge to said charge storage region during at least a portion of said integration period.

16. The pixel array of claim 15, wherein said transfer transistor is configured to continuously transfer charge to said charge storage region during said integration period.

17. A method of controlling an imager comprising an array of pixels, said method comprising the acts of:
    operating a first set of pixels in the array to obtain a set of image capture pixel signals during an integration period;
    capturing an image signal with said set of image capture pixel signals using a sample-and-hold circuit;
    operating a second set of pixels in the array to obtain a set of light control pixel signals, wherein said step of operating said second set of pixels includes connecting a photosensor of each of said second set of pixels to a respective charge collection region of said second set of pixels during said integration period;
    capturing said set of light control pixel signals using said sample-and-hold circuit; and
    performing automatic light control with said set of light control pixel signals,
    wherein said step of connecting said photosensor to said respective charge collection region of said second set of pixels during said integration period further comprises activating a transfer transistor during at least a portion of said integration period, wherein said transfer transistor is configured to prevent transfer of charge from said photosensor to said charge collection region when not activated.

* * * * *